United States Patent
Ding et al.

(10) Patent No.: US 11,424,234 B2
(45) Date of Patent: Aug. 23, 2022

(54) FLEXIBLE FOLDABLE DISPLAY SCREEN AND MANUFACTURING METHOD THEREOF

(71) Applicants: Kunshan New Flat Panel Display Technology Center Co., Ltd., Kunshan (CN); KunShan Go-Visionox Opto-Electronics Co., Ltd., Kunshan (CN)

(72) Inventors: Liwei Ding, Kunshan (CN); Xiuqi Huang, Kunshan (CN); Hui Zhu, Kunshan (CN); Xiaobao Zhang, Kunshan (CN)

(73) Assignees: Kunshan New Flat Panel Display Technology Center Co., Ltd, Kunshan (CN); KunShan Go-Visionox Opto-Electronics Co., Ltd., Kunshan (CN)

( * ) Notice: Subject to any disclaimer, the term of this patent is extended or adjusted under 35 U.S.C. 154(b) by 8 days.

(21) Appl. No.: 17/247,813

(22) Filed: Dec. 23, 2020

(65) Prior Publication Data
US 2021/0118865 A1    Apr. 22, 2021

Related U.S. Application Data

(63) Continuation-in-part of application No. 16/317,476, filed on Jan. 11, 2019, now abandoned, which is a
(Continued)

(30) Foreign Application Priority Data

Sep. 29, 2016   (CN) .......................... 201610864036.3

(51) Int. Cl.
*H01L 25/18*    (2006.01)
*H01L 27/15*    (2006.01)
*H01L 27/32*    (2006.01)

(52) U.S. Cl.
CPC ............ *H01L 25/18* (2013.01); *H01L 27/156* (2013.01); *H01L 27/3276* (2013.01); *H01L 2251/5338* (2013.01)

(58) Field of Classification Search
None
See application file for complete search history.

(56) References Cited

U.S. PATENT DOCUMENTS

2004/0227703 A1*  11/2004  Lamvik ................ G09G 3/3233
                                                           348/E5.145
2014/0218971 A1*   8/2014  Wu ........................ G02B 6/08
                                                                  362/613
(Continued)

OTHER PUBLICATIONS

EP First Office Action dated Oct. 7, 2021 in EP Application No. 17854726.1.

*Primary Examiner* — Xiaoming Liu
(74) *Attorney, Agent, or Firm* — Rimon PC

(57) ABSTRACT

The present disclosure provides a flexible foldable display screen includes a glass substrate, a flexible screen body disposed on the glass substrate, and a controlling IC disposed at a top of the curing assembling area. The flexible screen body has a curing assembling area defined at an end thereof, and a display area disposed outside the curing assembling area. The glass substrate is disposed at a bottom of the curing assembling area, with the display area exposed from the glass substrate. The display area comprises a pixel sparse area formed at an edge of the display area, and a pixel dense area formed outside the pixel sparse area. A pixel unit density of pixel units in the pixel dense area is greater than that of pixel units in the pixel sparse area.

6 Claims, 3 Drawing Sheets

Related U.S. Application Data continuation of application No. PCT/CN2017/102279, filed on Sep. 19, 2017.

(56) References Cited

U.S. PATENT DOCUMENTS

| | | |
|---|---|---|
| 2015/0371612 A1 | 12/2015 | Deluca |
| 2016/0014912 A1* | 1/2016 | Shih .................. H05K 3/30 |
| | | 29/831 |

* cited by examiner

FLEXIBLE FOLDABLE DISPLAY SCREEN AND MANUFACTURING METHOD THEREOF

CROSS-REFERENCE TO RELATED APPLICATIONS

This application is a continue-in-part of U.S. Ser. No. 16/317,476 filed on Jan. 11, 2019, which is a continuation of international application No. PCT/CN2017/102279 filed on Sep. 19, 2017, claiming priority of Chinese Patent Application No. 201610864036.3, entitled "flexible foldable display screen and manufacturing method thereof" filed on Sep. 29, 2016. Both applications are incorporated herein in their entirety by reference.

TECHNICAL FIELD

The present disclosure relates to a structure and a manufacturing method of a display screen, and more particularly, to a structure and a manufacturing method of a flexible foldable display screen.

BACKGROUND

Flexible display screens have the advantage of significant flexibility deformation, and may be bent and folded at a large angle, and thus the portability of devices may be effectively improved by using this type of screen. With the maturity of flexible display technologies, the flexible display screens have gradually integrated into mobile devices such as mobile phones and tablets, and become main tools of our lives.

The existed (rigid or semi-rigid) display screens generally include a glass substrate (layer), a flexible screen body (layer) and a controlling IC (layer) combined sequentially. The flexible screen body for displaying images includes pixel units densely arranged on a flexible substrate and signal lines (harnesses) disposed at the periphery of the pixel units and traced at the edge of the flexible screen body. The controlling IC for generating control signals or power signals uses a flexible circuit board (FPC) carrying chip components and a cured packaged integrated circuit module. The glass substrate for supporting and curing the flexible screen body uses an elastic and rigid glass substrate. The existed display screens also include a power circuit, which includes a semi-cured core and a larger size power component.

How to separate the flexible screen body from the whole screen individually, how to fully utilize characteristics of the flexible screen body to form good display effect, how to reflect display quality of the flexible screen body, and how to eliminate negative influence of control lines while ensuring the display effect and quality need to be redesigned or technically improved.

SUMMARY

In view of the above, embodiments of the present disclosure provide a method for manufacturing a flexible foldable display screen, which solves technical problems that display effect becomes worse due to the screen circuit and the driving chip are damaged during bending or peeling process of the flexible screen body.

The embodiments of the present disclosure further provide a flexible foldable display screen, which solves a technical problem that existed mobile devices cannot fully utilize the flexible screen body to improve the display effect.

The flexible foldable display screen includes a glass substrate, a flexible screen body disposed on the glass substrate, and a controlling IC disposed at a top of the curing assembling area. The flexible screen body has a curing assembling area defined at an end thereof, and a display area disposed outside the curing assembling area. The glass substrate is disposed at a bottom of the curing assembling area, with the display area exposed from the glass substrate. The display area comprises a pixel sparse area formed at an edge of the display area, and a pixel dense area formed outside the pixel sparse area. A pixel unit density of pixel units in the pixel dense area is greater than that of pixel units in the pixel sparse area.

According to the method for manufacturing a flexible foldable display screen of the present disclosure, characteristics of the present flexible screen bodies may be fully utilized and existed display screen products may be fully utilized, to form a flexible display screen that meets the requirement of the market. By concentrating the components which are not easily bent or folded on the curing assembling area of the flexible screen body that does not need to be peeled off, technical problems that display effect becomes worse due to the screen circuit and the driving chip are damaged during bending or peeling process of the flexible screen body are solved.

The flexible foldable display screen of the present disclosure has reliable quality and fully utilizes a flexible platform; a screen formed by the display area may display without borders, and meanwhile, reliable transmission of control signals and power signals may be ensured.

DETAILED DESCRIPTION

Figure 1:
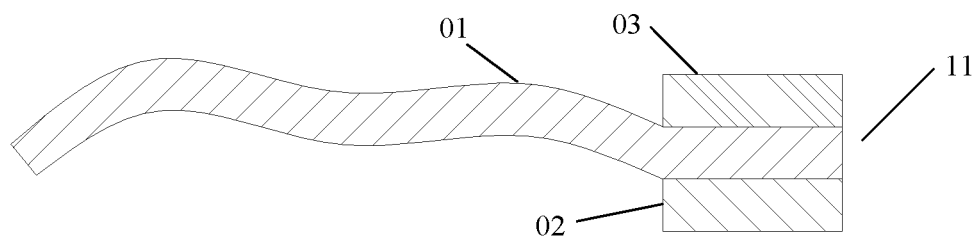
FIG. 1 is a front cross-sectional view of a flexible foldable display screen according to an embodiment of the present disclosure.

Technical solutions in the embodiments of the present disclosure will be described clearly and completely with reference to the accompanying drawings in the present disclosure. Apparently, the embodiments described herein are merely some but not all the embodiments of the present disclosure. Based on embodiments of the present disclosure, all other embodiments obtained by those skilled in the art without paying creative effort belong to the protection scope of the present disclosure.

Specifically, a flexible foldable display screen, comprises a glass substrate, a flexible screen body disposed on the glass substrate. The flexible screen body includes a curing assembling area defined at an end thereof, and a display area disposed outside the curing assembling area; and a controlling IC disposed at a top of the curing assembling area. The glass substrate is disposed at a bottom of the curing assembling area, with the display area exposed from the glass substrate. n the display area comprises a pixel sparse area formed at an edge of the display area, and a pixel dense area formed outside the pixel sparse area, a pixel unit density of pixel units in the pixel dense area greater than that of pixel units in the pixel sparse area.

The end of the above-mentioned flexible screen body may be an edge of the flexible screen body extending along an extension direction of the flexible screen body, or a pair of opposite (two) edges of the flexible screen body extending along the extension direction of the flexible screen body, or a part of the edge of the flexible screen body, or a part of the opposite edges of the flexible screen body, or an interval portion of the edge of the flexible screen body, or an interval portion of the opposite edges of the flexible screen body.

The above-mentioned interval portion refers to two or more portions spaced from each other.

The above-mentioned touch input region could be formed at any position of the glass substrate, for example, the touch input region could be formed between one side of the glass substrate adjacent to the flexible screen body and the display area, or at the other side of the glass substrate away from the flexible screen body, and the present disclosure is not limited thereto.

The above-mentioned forming the touch input region includes disposing corresponding circuits and connecting the circuits.

In addition, normally, a monochromatic strip formed by signal line harnesses traced at the edge of the display area further forms a monochrome border (for example, black) at the edge of the flexible screen body, which affects the overall display effect of the flexible screen body. To solve this problem, the method for manufacturing a flexible foldable display screen of the embodiment further includes: forming a pixel sparse area at an edge of the display area, wherein the pixel unit density of the pixel unit disposed in the pixel sparse area is smaller than that of the pixel unit disposed outside the pixel sparse area, a pitch between adjacent pixel units in the pixel sparse area accommodates to an outer diameter of signal lines; and the signal lines are evenly disposed between the pixel units in the pixel sparse area.

The above-mentioned pixel unit density refers to the number of pixel units disposed in a unit area.

In the method for manufacturing a flexible foldable display screen of the embodiment, by reducing the pixel unit density at the edge of the flexible screen body in the display area, small line trace space for the tracing of a signal line could be divided at the edge of the display area by utilizing the pixel unit. Since the line trace space is orderly distributed, signal lines in wiring harnesses may be distributed as evenly as possible; meanwhile, diffraction and brightness effects generated when the pixel unit emits light may effectively reduce the differential reflection of a single signal line. In this way, a monochrome strip at the edge of the display area is eliminated, and borderless effect is obtained, and thus the overall display effect of the flexible screen body is significantly improved.

The method for manufacturing a flexible foldable display screen of the embodiment further includes: in the pixel sparse area, a pixel matrix is formed by adjacent pixel units; the pixel matrix is evenly arranged; a pitch of adjacent pixel matrices in the pixel sparse area accommodates to an outer diameter of signal lines; and signal lines are evenly arranged between the pixel matrices.

The above-mentioned pixel matrix could be composed of adjacent pixel units to form a triangle, a rectangle, a diamond or other polygonal contour.

In the method for manufacturing a flexible foldable display screen of the embodiment, the pixel unit density may be adjusted locally in the pixel sparse area, to accommodate to the number of the signal lines and the distance of tracing.

The method for manufacturing a flexible foldable display screen of the embodiment further includes: in the pixel sparse area, a pixel unit density is gradually decreased from an inner side (a side toward the middle of the flexible screen body, vertical or non-vertical) to an outer side (a side toward the edge of the flexible screen body, vertical or non-vertical); in the pixel sparse area, the pitch of pixel units gradually becomes larger and accommodates to the outer diameter of the signal lines; and the signal lines are evenly disposed between the pixel units in the pixel sparse area.

The pixel unit density outside the pixel sparse area is larger than that in the inner side of the pixel sparse area, and the pixel unit density in the inner side of the pixel sparse area is larger than that in the outer side of the pixel sparse area.

In the method for manufacturing a flexible foldable display screen of the embodiment, a sparse tracing area and a dense tracing area could be formed in the sparse pixel area under the premise of ensuring the display effect, and thus a reasonable tracing of the signal harnesses is ensured. The dense tracing at the extreme edge has the lowest visual effect quality. However, the borders of the monochromatic strips are not formed may be still ensured, and thus a frameless effect is realized.

FIG. 1 is a front cross-sectional view of a flexible foldable display screen according to an embodiment. As shown in FIG. 1, the flexible foldable display screen of the embodiment includes a flexible screen body 01, a glass substrate 02 and a controlling IC 03. A curing assembling area 11 is defined at an end of the flexible screen body 01. A flexible screen body outside the curing assembling area 11 is used as a display area. The controlling IC 03 is disposed at the top of the curing assembling area 11, and the glass substrate 02 is disposed at the bottom of the curing assembling area 11. The glass substrate 02 is disposed at a bottom of the curing assembling area 11, with the display area exposed from the glass substrate 02.

Figure 2:
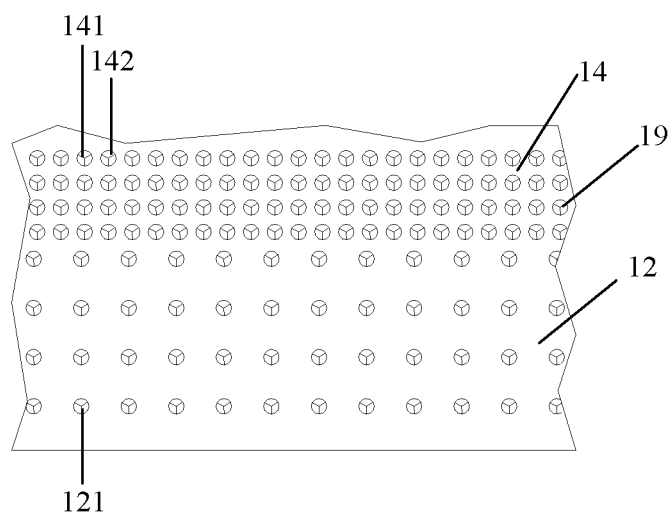
FIG. 2 is a structure diagram (a plan view) of a pixel unit arrangement of a flexible screen body of a display area in a flexible foldable display screen according to an embodiment of the present disclosure.
Figure 3:
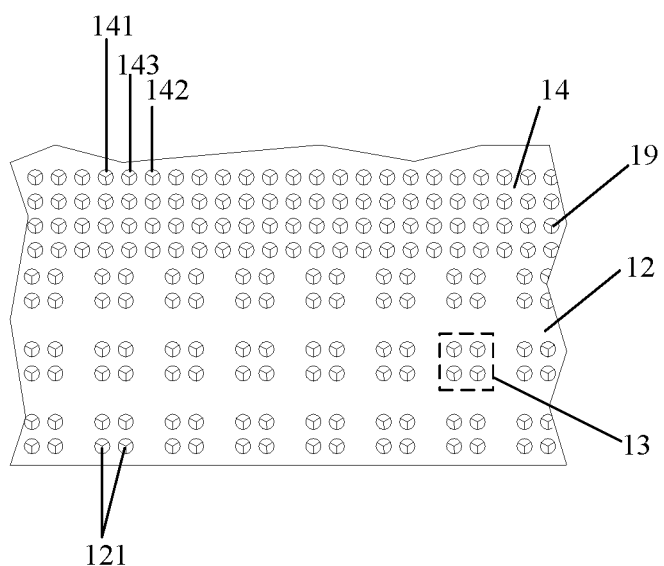
FIG. 3 is a structure diagram (a plan view) of a pixel unit arrangement of a flexible screen body of a display area in a flexible foldable display screen according to another embodiment of the present disclosure.

FIGS. 2 and 3 are structure diagrams (plan view) of two pixel unit arrangements of a flexible screen body of a display area in a flexible foldable display screen, respectively. The display area comprises a pixel sparse area 12 formed at an edge of the display area, and a pixel dense area 14 formed outside the pixel sparse area 12. A first column 141 of pixels in the pixel dense area 14 is aligned with a second column 121 of pixels in the pixel sparse area along a column direction, with a third column 142 of pixels in the pixel dense area 14 aligned with a space of the pixel sparse area 12, to make a pixel unit density of pixel units in the pixel dense area 14 greater than that of pixel units in the pixel sparse area 12.

A pitch between pixel units 19 in the pixel sparse area 12 accommodates to an outer diameter of a signal line, which is equal to or slightly larger than the outer diameter of the signal line.

Signal lines are evenly disposed between pixel units 19 in the pixel sparse area 12.

As shown in FIG. 3, based on the structure of the previous embodiment, the pixel sparse area 12 has a plurality of pixel units 19 forming a plurality of separated pixel matrices 13, the plurality of pixel matrices 13 are evenly arranged and have a same shape. The first column of pixels 141 and an adjacent fourth column 143 of pixels in the pixel dense area 14 are aligned with two second columns 121 of pixels of the pixel matrix 13 in the pixel sparse area 12 along the column direction. The third column 142 of pixels is adjacent to the fourth column 143 of pixels.

The pitch between adjacent pixel matrices 13 in the pixel sparse area 12 accommodates to the outer diameter of a signal line.

The signal line is evenly arranged between pixel matrices 13 in the pixel sparse area 12.

Figure 4:
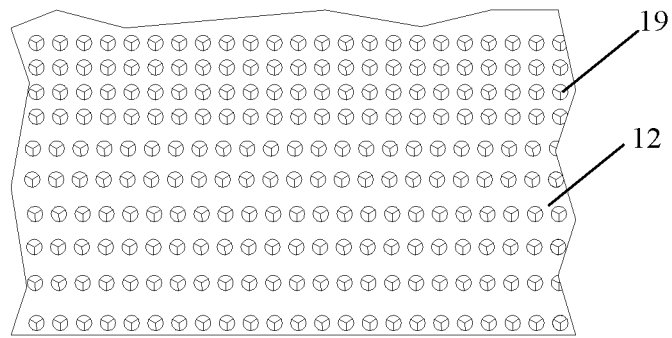
FIG. 4 is a structure diagram (a plan view) of a pixel unit arrangement of a flexible screen body of a display area in a flexible foldable display screen according to another embodiment of the present disclosure.

FIG. 4 is a structure diagram (a plan view) of a pixel unit arrangement of a flexible screen body of a display area in a flexible foldable display screen according to another embodiment. As shown in FIG. 4, based on the structure of the previous embodiment, the pixel unit density of the pixel unit 19 is gradually decreased row-by-row from an inner side to an outer side in the pixel sparse area 12. The pitch between pixel units in the pixel sparse area 12 gradually becomes larger row-by-row from an inner side to an outer side and accommodates to the outer diameter of the signal line.

The signal line is evenly arranged between pixel units in the pixel sparse area.

Figure 5:
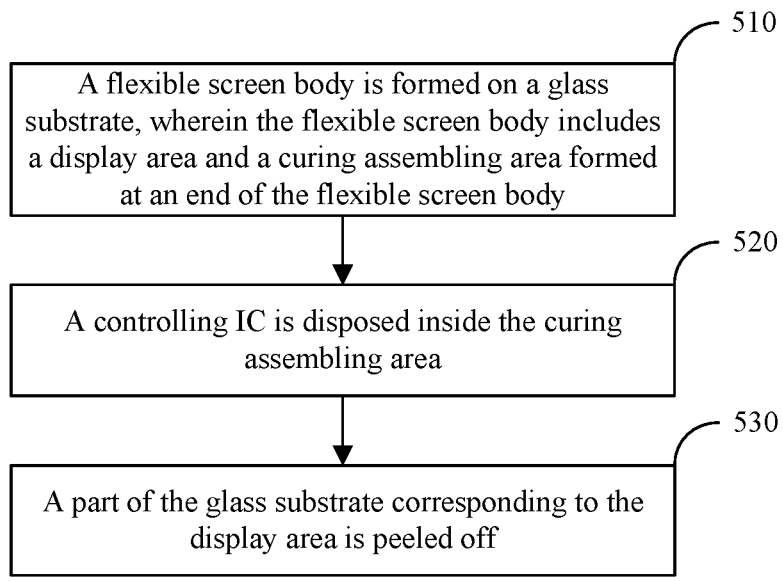
FIG. 5 is a flowchart of a method for manufacturing a flexible foldable display screen of the present disclosure.

FIG. 5 is a flowchart of a method for manufacturing a flexible foldable display screen of the present disclosure. As shown in FIG. 5, the method includes following steps.

510: a flexible screen body is formed on a glass substrate, wherein the flexible screen body includes a display area and a curing assembling area formed at an end of the flexible screen body.

520: a controlling IC is disposed in the curing assembling area.

530: a part of the glass substrate corresponding to the display area is peeled off.

In the embodiment of the present disclosure, a size of the glass substrate is adjusted, for example, a part of the glass substrate corresponding to the display area is peeled off, and the residual glass substrate after the peeling process accommodates to the curing assembling area.

The above description is only preferred embodiments of the present disclosure and should not be intended to limit the present disclosure. Those skilled in the art can make various modifications and variations to the present disclosure. Any modification, equivalent substitution, improvement etc. made within the spirit and principle of the present disclosure should be encompassed in the protection scope of the present disclosure.

INDUSTRIAL APPLICABILITY

In the method for manufacturing a flexible foldable display screen of the present disclosure, by concentrating the components which are not easily bent or folded on the curing assembling area of the flexible screen body that does not need to be peeled off, a peeling yield of the flexible screen body peeling from the glass substrate and the controlling IC could be ensured, and the screen circuit and the driving chip would not be damaged. The flexible foldable display screen of the present disclosure has reliable quality and fully utilizes a flexible platform; a screen formed by the display area may display without borders, and meanwhile, reliable transmission of control signals and power signals may be ensured.

What is claimed is:

1. A flexible foldable display screen, comprising:
a glass substrate;
a flexible screen body disposed on the glass substrate, the flexible screen body having a curing assembling area defined at an end thereof, and a display area disposed outside the curing assembling area; and
a controlling IC disposed at a top of the curing assembling area,
wherein the glass substrate is disposed at a bottom of the curing assembling area, with the display area exposed from the glass substrate;
wherein the display area comprises a pixel sparse area formed at an edge of the display area, and a pixel dense area formed outside the pixel sparse area,
a pixel unit density of pixel units in the pixel dense area greater than that of pixel units in the pixel sparse area,
wherein a first column of pixels in the pixel dense area is aligned with a second column of pixels in the pixel sparse area along a column direction, with a third column of pixels in the pixel dense area aligned with a space of the pixel sparse area, to make a pixel unit density of pixel units in the pixel dense area greater than that of pixel units in the pixel sparse area,
wherein the pixel sparse area has a plurality of pixel units forming a plurality of separated pixel matrices, the plurality of pixel matrices are evenly arranged and have a same shape,
wherein the first column of pixels and an adjacent fourth column of pixels in the pixel dense area are aligned with two second columns of pixels of the pixel matrix in the pixel sparse area along the column direction, the third column of pixels is adjacent to the fourth column of pixels,
wherein the third column of pixels in the pixel dense area is aligned with a space between two adjacent pixel matrices in the pixel sparse area.

2. The flexible foldable display screen of claim 1, wherein a pixel unit density is gradually decreased row-by-row from an inner side to an outer side in the pixel sparse area, and a pitch between adjacent pixel units gradually becomes larger and accommodates to an outer diameter of a signal line.

3. The flexible foldable display screen of claim 1, wherein the end of the flexible screen body is an edge of the flexible screen body extending along an extension direction of the flexible screen body, or a pair of opposite edges of the flexible screen body extending along the extension direction of the flexible screen body, or a part of the edge of the flexible screen body, or a part of the opposite edges of the flexible screen body.

4. The flexible foldable display screen of claim 1, wherein a pitch between adjacent pixel units in the pixel sparse area along a row direction accommodates to an outer diameter of a signal line.

5. A flexible foldable display screen, comprising:
a glass substrate;
a flexible screen body disposed on the glass substrate, the flexible screen body having a curing assembling area defined at an end thereof, and a display area disposed outside the curing assembling area; and
a controlling IC disposed at a top of the curing assembling area,
wherein the glass substrate is disposed at a bottom of the curing assembling area, with the display area exposed from the glass substrate;

wherein the display area comprises a pixel sparse area formed at an edge of the display area, and a pixel dense area formed outside the pixel sparse area, a pixel unit density of pixel units in the pixel dense area greater than that of pixel units in the pixel sparse area, wherein a pixel unit density is gradually decreased row-by-row from an inner side to an outer side in the pixel sparse area, and a pitch between adjacent pixel units gradually becomes larger and accommodates to an outer diameter of a signal line.

6. The flexible foldable display screen of claim 5, wherein a size of each pixel in the pixel sparse area is same as a size of each pixel in the pixel dense area.

* * * * *